(12) United States Patent
Kobayashi

(10) Patent No.: US 11,523,080 B2
(45) Date of Patent: Dec. 6, 2022

(54) PHOTOELECTRIC CONVERSION DEVICE AND ELECTRONIC DEVICE WITH A ΔΣ A/D CONVERTER

(71) Applicant: CANON KABUSHIKI KAISHA, Tokyo (JP)

(72) Inventor: Daisuke Kobayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/591,043

(22) Filed: Feb. 2, 2022

(65) Prior Publication Data

US 2022/0247965 A1    Aug. 4, 2022

(30) Foreign Application Priority Data

Feb. 4, 2021 (JP) .............................. JP2021-016894

(51) Int. Cl.
*H04N 5/3745* (2011.01)

(52) U.S. Cl.
CPC ..... *H04N 5/37455* (2013.01); *H04N 5/37452* (2013.01)

(58) Field of Classification Search
CPC .......... H04N 5/37455; H04N 5/37452; H04N 5/3745; H04N 5/378
See application file for complete search history.

(56) References Cited

U.S. PATENT DOCUMENTS

| | | |
|---|---|---|
| 9,142,575 B2 | 9/2015 | Kobayashi et al. |
| 9,344,656 B2 * | 5/2016 | Sumi ...................... H04N 5/379 |
| 9,900,539 B2 | 2/2018 | Yamasaki et al. |
| 10,194,103 B2 | 1/2019 | Saito et al. |
| 10,249,678 B2 | 4/2019 | Ryoki et al. |
| 10,504,949 B2 | 12/2019 | Kobayashi et al. |

(Continued)

FOREIGN PATENT DOCUMENTS

| | | |
|---|---|---|
| EP | 2889908 A1 | 7/2015 |
| JP | 2010-093365 A | 4/2010 |

(Continued)

OTHER PUBLICATIONS

U.S. Appl. No. 17/590,007, filed Feb. 1, 2022 (First Named Inventor: Tetsuya Itano).

(Continued)

*Primary Examiner* — Nicholas G Giles
(74) *Attorney, Agent, or Firm* — Venable LLP

(57) ABSTRACT

A photoelectric converter comprising a pixel unit and a processor configured to process a pixel signal output from the pixel unit is provided. The processor comprises a ΔΣ AD converter configured to convert the pixel signal into a digital signal. The ΔΣ AD converter comprises a subtracter to which the pixel signal and a subtraction signal are input, an integrator configured to receive an output from the subtracter, a comparator configured to compare an output from the integrator with a predetermined voltage, a decimation filter configured to generate the digital signal based on an output from the comparator, a delay unit configured to delay an output from the comparator, a buffer configured to buffer an output from the delay unit, and a DA converter configured to convert an output from the buffer into an analog signal to generate the subtraction signal.

15 Claims, 8 Drawing Sheets

(56) References Cited

U.S. PATENT DOCUMENTS

| | | | |
|---|---|---|---|
| 10,834,354 B2 | 11/2020 | Kobayashi et al. | |
| 11,063,604 B2* | 7/2021 | Moue | H04N 5/378 |
| 2014/0160332 A1* | 6/2014 | Sumi | H04N 5/379 |
| | | | 348/308 |
| 2020/0059242 A1* | 2/2020 | Moue | H03M 3/43 |
| 2020/0336686 A1* | 10/2020 | Hosaka | H04N 5/378 |

FOREIGN PATENT DOCUMENTS

| | | |
|---|---|---|
| JP | 2015-126043 A | 7/2015 |
| JP | 2020-191543 A | 11/2020 |
| WO | 2019/069614 A1 | 4/2019 |

OTHER PUBLICATIONS

U.S. Appl. No. 17/693,597, filed Mar. 14, 2022 (First Named Inventor: Tetsuya Itano).

* cited by examiner

PHOTOELECTRIC CONVERSION DEVICE AND ELECTRONIC DEVICE WITH A ΔΣ A/D CONVERTER

BACKGROUND OF THE INVENTION

Field of the Invention

The present invention relates to a photoelectric conversion device and an electronic device.

Description of the Related Art

International Publication No. 2019/069614 discloses a solid-state image capturing apparatus that uses a delta-sigma (ΔΣ) analog-to-digital (A/D) converter in an analog-to-digital conversion unit.

SUMMARY OF THE INVENTION

In the ΔΣ AD converter disclosed in International Publication No. 2019/069614, the operation of a digital-to-analog (D/A) converter is controlled by a signal output from a quantizer (comparator). A signal for controlling the D/A converter can be delayed due to a parasitic resistance or a parasitic capacitance in a wiring pattern from the comparator to the D/A converter. If a signal delay amount is changed because of a manufacturing variation or a change in the environment due to the temperature or the like, it may generate a conversion error in each ΔΣ A/D converter or cause a variation in the operations of the ΔΣ A/D converters among the columns and may degrade the accuracy of A/D conversion.

Some embodiments of the present invention provide a technique advantageous in improving the conversion accuracy of a delta-sigma analog-to-digital converter.

According to some embodiments, a photoelectric conversion device comprising a pixel unit in which a plurality of pixels each including a photoelectric conversion element are arranged in a matrix, and a signal processor configured to process a pixel signal output from the pixel unit via a vertical signal line, wherein the signal processor comprises a ΔΣ A/D converter configured to convert the pixel signal into a digital signal, the ΔΣ A/D converter comprises a subtracter which includes a first input terminal to which the pixel signal is input and a second input terminal to which a subtraction signal is input, an integrator configured to receive an output from the subtracter, a comparator configured to compare an output from the integrator with a predetermined voltage, a decimation filter configured to generate the digital signal based on a comparison result output from the comparator, a delay unit configured to delay an output from the comparator, a buffer unit configured to buffer an output from the delay unit, and a D/A converter configured to convert an output from the buffer unit into an analog signal to generate the subtraction signal, is provided.

According to some other embodiments, a photoelectric conversion device comprising a pixel unit in which a plurality of pixels each including a photoelectric conversion element are arranged in a matrix, and a signal processor configured to process a pixel signal output from the pixel unit via a vertical signal line, wherein the signal processor comprises a conversion circuit configured to convert the pixel signal from a voltage signal into a current signal and a ΔΣ A/D converter configured to convert the pixel signal, which has been converted into the current signal by the conversion circuit, into a digital signal, the ΔΣ A/D converter includes a subtracter which comprises a first input terminal to which the pixel signal is input and a second input terminal to which a subtraction signal is input, an integrator configured to receive an output from the subtracter, a comparator configured to compare an output from the integrator with a predetermined voltage, a decimation filter configured to generate the digital signal based on a comparison result output from the comparator, a buffer unit configured to buffer an output from the comparator, and a D/A converter configured to convert an output from the buffer unit into an analog signal to generate the subtraction signal, is provided.

Further features of the present invention will become apparent from the following description of exemplary embodiments (with reference to the attached drawings).

DESCRIPTION OF THE EMBODIMENTS

Figure 1:
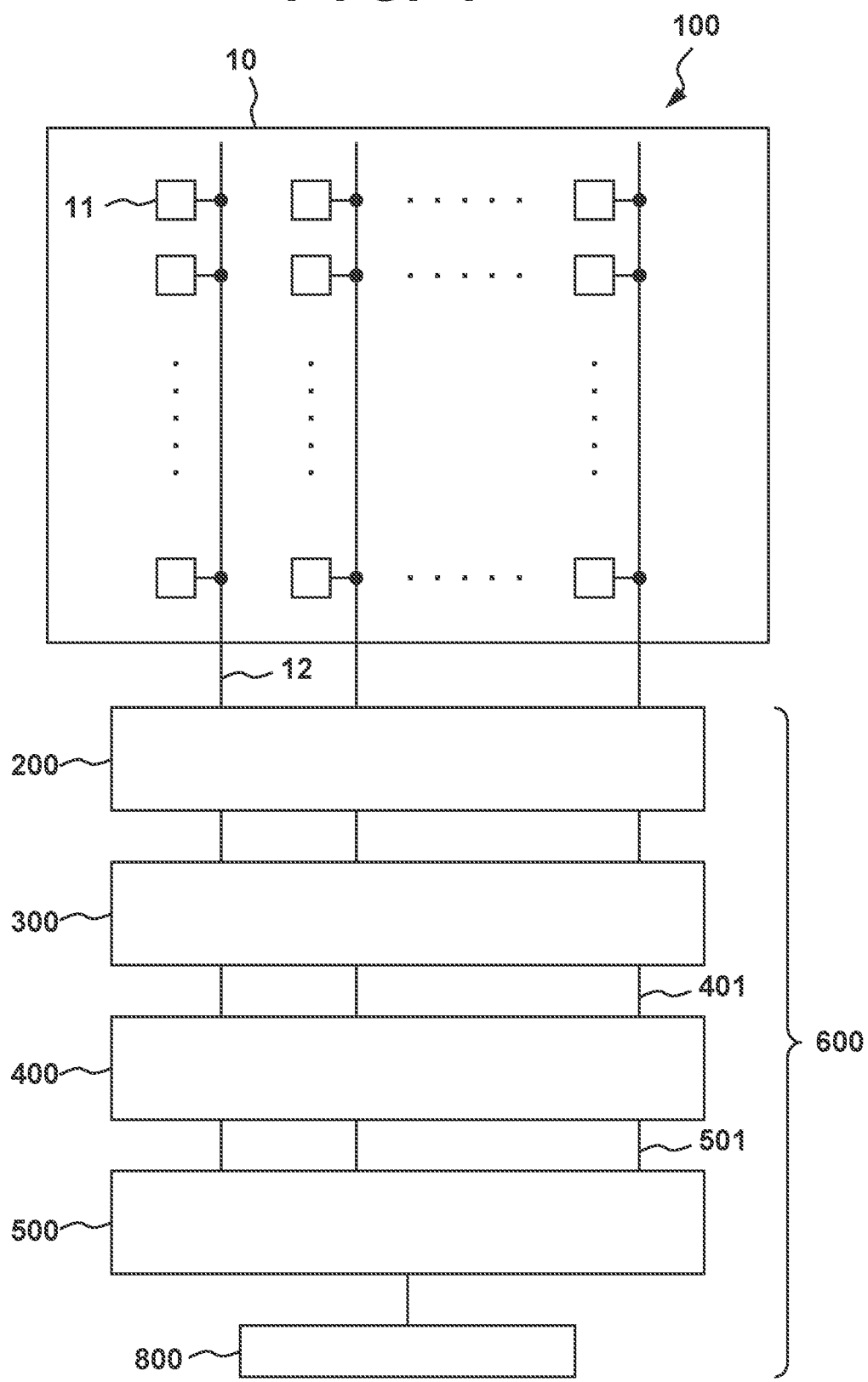
FIG. 1 is a block diagram showing a schematic arrangement of a photoelectric conversion device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A photoelectric conversion device according to an embodiment of the present invention will be described with reference to FIGS. 1 to 12. FIG. 1 is a block diagram showing an example of the arrangement of a photoelectric conversion device 100 according to an embodiment. The photoelectric conversion device 100 includes a pixel unit 10 and a signal processor 600 which processes pixel signals output from the pixel unit 10 via corresponding vertical signal lines 12. The signal processor 600 includes a current supply unit 200, a sample-and-hold unit 300, an analog-to-digital (A/D) conversion unit 400, a digital signal processor 500, and an output unit 800. The photoelectric conversion device 100 may be a so-called CMOS image sensor.

In the pixel unit 10, a plurality of pixels 11, each including a photoelectric conversion element, are arranged in a matrix. Assume here that a row direction indicates a horizontal direction in FIG. 1, and a column direction indicates a vertical direction in FIG. 1. Each pixel 11 generates a signal charge corresponding to incident light.

In the pixel unit 10, the vertical signal line 12 is arranged along the column direction in correspondence with each pixel column arranged with the pixels 11. The vertical signal lines 12 may be arranged so that a single vertical signal line will correspond to a single pixel column or so that a plurality of vertical signal lines will be arranged for a single pixel column. Each vertical signal line 12 transfers, from each pixel 11 to the sample-and-hold unit 300, a pixel signal corresponding to the signal charge generated by the photoelectric conversion element of the pixel 11.

The current supply unit 200 is arranged in correspondence with the vertical signal lines 12. The current supply unit 200 supplies, via each vertical signal line 12, a bias current to the corresponding pixel 11 selected for pixel signal readout.

The sample-and-hold unit 300 samples and holds, from the pixel unit 10 via the vertical signal line 12, the signal generated by the photoelectric conversion element of each pixel 11. For example, in the sample-and-hold unit 300, two sample-and-hold circuits, which are a sample-and-hold circuit for sampling the signal when the photoelectric conversion element has been reset and a sample-and-hold circuit for sampling the signal when a photoelectric conversion operation has been performed in the photoelectric conversion element, can be connected to one vertical signal line 12.

The A/D conversion unit 400 performs analog-to-digital conversion on each pixel signal input from the sample-and-hold unit 300 via a corresponding signal line 401. In the A/D conversion unit, a delta-sigma ($\Delta\Sigma$) analog-to-digital (A/D) converter (to be also denoted as a $\Delta\Sigma$ A/D converter hereinafter) that converts an analog pixel signal into a digital signal is connected in correspondence with each vertical signal line 12. The $\Delta\Sigma$ A/D converter will be described later.

The digital signal processor 500 processes each digital signal output from the A/D conversion unit 400 via a corresponding signal line 501. For example, the digital signal processor may perform correction processing, interpolation processing, or the like on each digital signal output from the A/D conversion unit 400. The output unit 800 outputs, from the photoelectric conversion device 100 to an external device, each signal processed by the digital signal processor 500.

Figure 2:
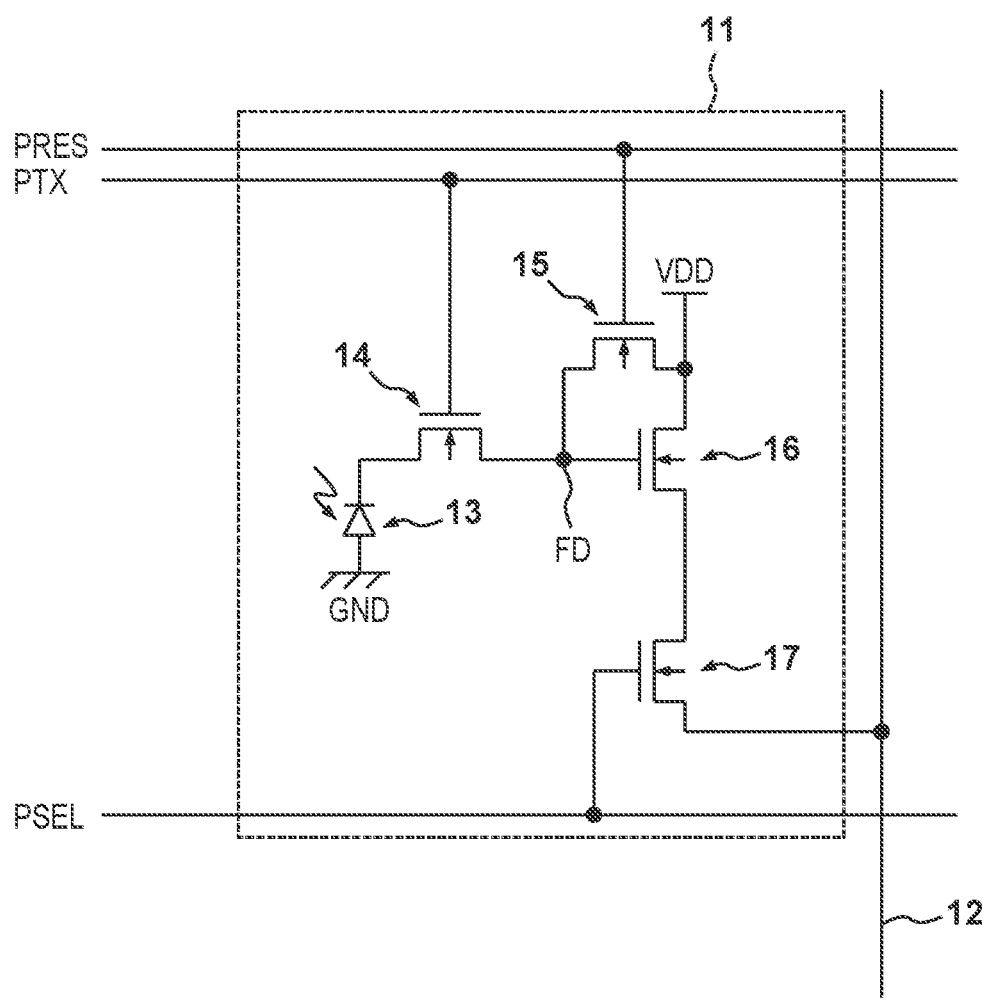
FIG. 2 is a circuit diagram showing an example of the arrangement of a pixel of the photoelectric conversion device of FIG. 1.

FIG. 2 is a circuit diagram showing an example of the arrangement of the pixel 11. The pixel 11 includes a photoelectric conversion element 13, a transfer transistor 14, a reset transistor 15, an amplification transistor 16, and a selection transistor 17. The photoelectric conversion element 13 can be, for example, a photodiode. The photoelectric conversion element 13 has main electrodes, one of which is connected to a ground potential GND, photoelectrically converts received light into a signal charge of a charge amount corresponding to the amount of the received light, and accumulates the signal charge. The other of the main electrodes of the photoelectric conversion element 13 is electrically connected to the gate electrode of the amplification transistor 16 via the transfer transistor 14. Anode FD, to which the gate electrode of the amplification transistor 16 is electrically connected, functions as a floating diffusion. The node FD which functions as the floating diffusion is a charge-to-voltage conversion unit that converts the signal charge generated by the photoelectric conversion element 13 into a signal voltage.

A transfer signal PTX is supplied to the gate electrode of the transfer transistor 14. When the transfer transistor 14 is set in a conductive state in accordance with the transfer signal PTX, photoelectric conversion is executed in the photoelectric conversion element 13, and the signal charge accumulated in the photoelectric conversion element 13 is transferred to the node FD which functions as a floating diffusion.

The reset transistor 15 is connected between a power supply potential VDD and the node FD. The expression here that "a transistor is connected between A and B" represents a state in which one of the main electrodes of the transistor is connected to A and the other of the main electrodes is connected to B. In addition, the gate electrode of the transistor is connected to neither A nor B.

A reset signal PRES is supplied to the gate electrode of the reset transistor 15. When the reset transistor 15 is set in a conductive state in accordance with the reset signal PRES, the potential of the node FD (floating diffusion) is reset to the power supply potential VDD, and the charge accumulated in the floating diffusion is swept out.

The amplification transistor 16 is connected between the power supply potential VDD and the selection transistor 17, and the gate electrode of the amplification transistor 16 is connected to the node FD. The amplification transistor 16 is an input unit of a source follower which reads out the signal obtained from the photoelectric conversion by the photoelectric conversion element 13. That is, the other of the main electrodes of the amplification transistor 16 is connected to the vertical signal line 12 via the selection transistor 17. The amplification transistor 16 and the above-described current supply unit 200 connected to the vertical signal line 12 form a source follower which converts the voltage of the node FD into a potential of the vertical signal line 12.

The selection transistor 17 is connected between the amplification transistor 16 and the vertical signal line 12. A selection signal PSEL is supplied to the gate electrode of the selection transistor 17. When the selection transistor 17 is set in a conductive state in accordance with the selection signal PSEL, the pixel 11 is set in a selected state, and a signal output from the amplification transistor 16 is transmitted to the vertical signal line 12.

The circuit arrangement of the pixel 11 is not limited to the arrangement shown in FIG. 2. For example, the selection transistor 17 may be connected between the power supply potential VDD and the amplification transistor 16. Also, although the arrangement shown in FIG. 2 shows, as the pixel 11, a so-called four-transistor arrangement including the transfer transistor 14, the reset transistor 15, the amplification transistor 16, and the selection transistor 17, the present invention is not limited to this. For example, the pixel 11 may have a three-transistor arrangement in which the selection transistor 17 is omitted and the amplification transistor 16 also functions as a selection transistor. Alternatively, depending on the specifications required for the photoelectric conversion device 100, an arrangement with an increased number of transistors such as an arrangement having five transistors or more may be used as the pixel 11.

Figure 3A:
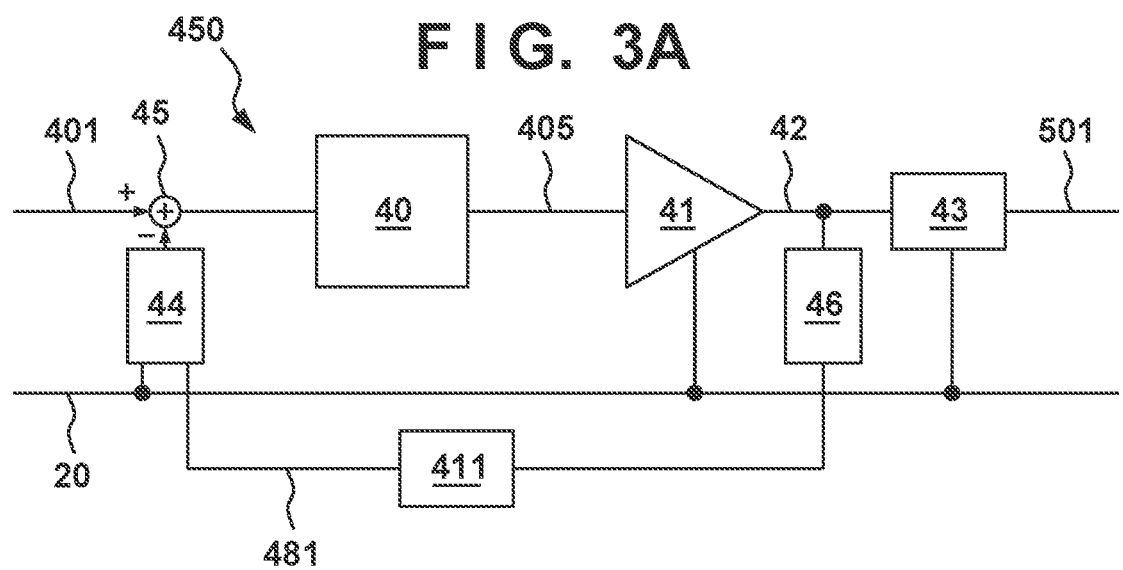
FIGS. 3A to 3C are views each showing an example of the arrangement of a ΔΣ A/D converter of the photoelectric conversion device of FIG. 1.

A ΔΣ A/D converter 450 that is arranged in the A/D conversion unit 400 and converts the pixel signal into a digital signal will be described next with reference to FIG. 3A. The ΔΣ A/D converter 450 includes a subtracter 45, an integrator 40, a comparator 41 (to be also referred to as a quantizer), a digital-to-analog (D/A) converter 44, and a decimation filter 43. The subtracter 45 includes an input (+) terminal to which a pixel signal from the sample-and-hold unit 300 is input via the signal line 401 and an input (−) terminal to which a subtraction signal is input. The integrator 40 receives an output from the subtracter 45 and outputs an integrated value to the comparator 41 via a signal line 405. The comparator 41 compares the output from the integrator 40 with a predetermined voltage. If a signal output as a comparison result from the comparator 41 is 1 bit, the predetermined voltage can be one kind of voltage. If the output from the comparator 41 is 2 bits or more, the comparator 41 will output a comparison result obtained by comparing the output from the integrator 40 with a plurality of kinds of voltages. The decimation filter 43 generates a digital signal based on the comparison result output from the comparator 41 via a signal line 42, and outputs the generated digital signal to the digital signal processor 500 via the signal line 501. The D/A converter 44 converts the output from the comparator 41 via the vertical signal line 12 into an analog signal, and generates the subtraction signal to be output to the input (−) terminal of the subtracter 45. The subtracter 45 obtains a difference between the pixel signal supplied to the input (+) terminal and the subtraction signal supplied to the input (−) terminal to feed back a previously sampled data value to the pixel signal, thereby reducing the quantization noise. In FIG. 3A, a signal line 20 can be the ground potential GND.

In the arrangement shown in FIG. 3A, to feed back the subtraction signal output from the comparator 41 to the pixel signal input to the subtracter 45, the ΔΣ A/D converter 450 includes a delay unit 46 that delays the signal of the comparison result output from the comparator 41. On the other hand, a signal to be input to the ΔΣ A/D converter 450 can also be delayed in the integrator 40 or the comparator 41. In addition, a delay can also occur due to a parasitic load or the like in the signal line 405 or 42 in the ΔΣ A/D converter 450. Hence, it can also be said that the delay unit 46 represents a delay component in a circuit or a signal line in the ΔΣ A/D converter 450. Hence, the ΔΣ A/D converter 450 may not include some kind of element as the delay unit 46.

The D/A converter 44 is controlled by the output (comparison result) from the comparator 41. As described above, the output from the comparator 41 for controlling the D/A converter 44 can be delayed due to a parasitic resistance or a parasitic capacitance in the wiring pattern of the signal line 42 from the comparator 41 to the D/A converter 44. For example, if the signal line 42 is laid out to extend in a single direction like a column circuit, the influence of the parasitic load of the signal line 42 will increase, and the signal will be delayed. In addition, the delay amount of this delay may change depending on a manufacturing variation in the photoelectric conversion device 100 or a change in the environment due to the temperature or the like. The variation or the change in the delay amount can generate a conversion error in the ΔΣ A/D converter 450 or cause operational variation among the ΔΣ A/D converters 450 arranged in correspondence with the vertical signal lines 12. As a result, it may degrade the image quality of an image obtained by the photoelectric conversion device 100.

Hence, in this embodiment, a buffer unit 411 that buffers a signal, which is output from the comparator 41 and is input to the D/A converter 44 via the signal line 42, is arranged between the comparator 41 and the D/A converter 44. The control by the D/A converter 44 influences the accuracy of the A/D conversion by the ΔΣ A/D converter 450. Hence, by improving the driving force of the D/A converter 44 with respect to the comparator 41 and adding an appropriate delay amount, the variation in the delay amount due to a parasitic load will be reduced, and the degradation of the accuracy of the A/D conversion will be suppressed. In addition, a delay amount variation among the columns corresponding to the vertical signal lines 12 can also be reduced by arranging the buffer unit 411, thus reducing an A/D conversion variation among the columns.

Figure 4A:
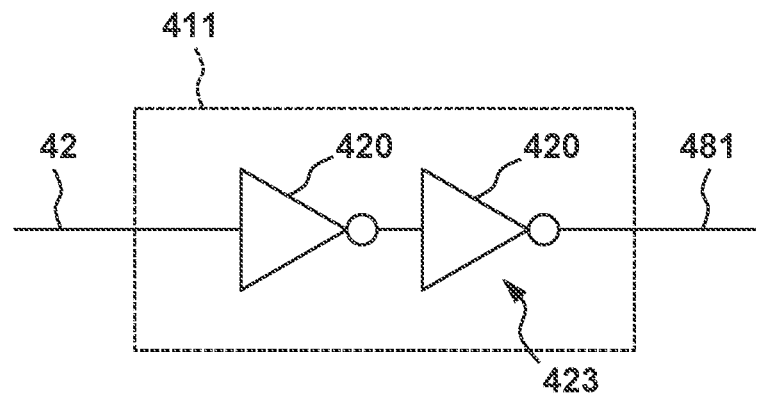
FIGS. 4A and 4B are views each showing an example of the arrangement of a buffer unit of the ΔΣ A/D converter of the photoelectric conversion device of FIG. 1.
Figure 4B:
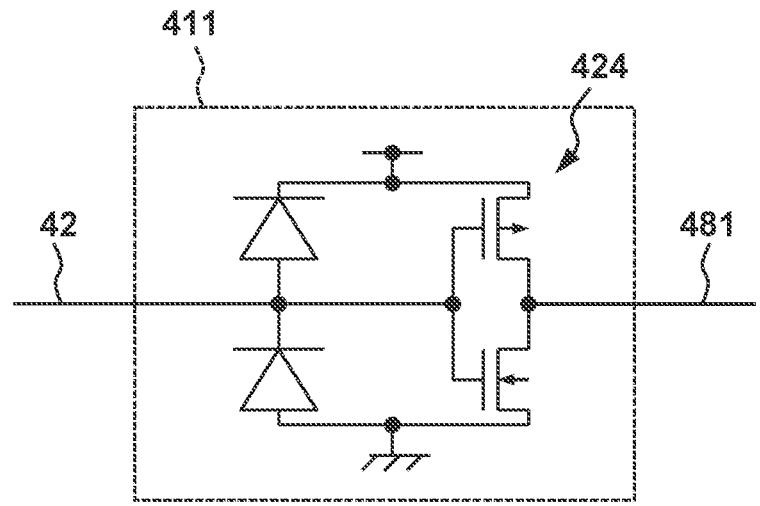

For example, as shown in FIG. 4A, the buffer unit 411 can include an amplifier 423 which is formed by two stages of inverter circuits 420. Since the buffer unit 411 buffers the output of the comparator 41, the output from the comparator 41 (the output from the delay unit 46) is amplified and undergoes waveform shaping, impedance conversion, and the like. As a result, the accuracy of the A/D conversion is improved. In addition, for example, as shown in FIG. 4B, the buffer unit 411 can include a level shifter 424 to convert the level of the output from the comparator 41. If there is a mismatch between the output (for example, the power supply voltage) of the comparator 41 and the control voltage of the D/A converter 44, the voltage of signal can be increased or decreased in the buffer unit 411 to allow the D/A converter 44 to operate appropriately. The circuit arrangement of the amplifier 423 and that of the level shifter 424 are not limited to those shown in FIGS. 4A and 4B, respectively, and a circuit having an appropriate arrangement can be used.

Figure 3B:
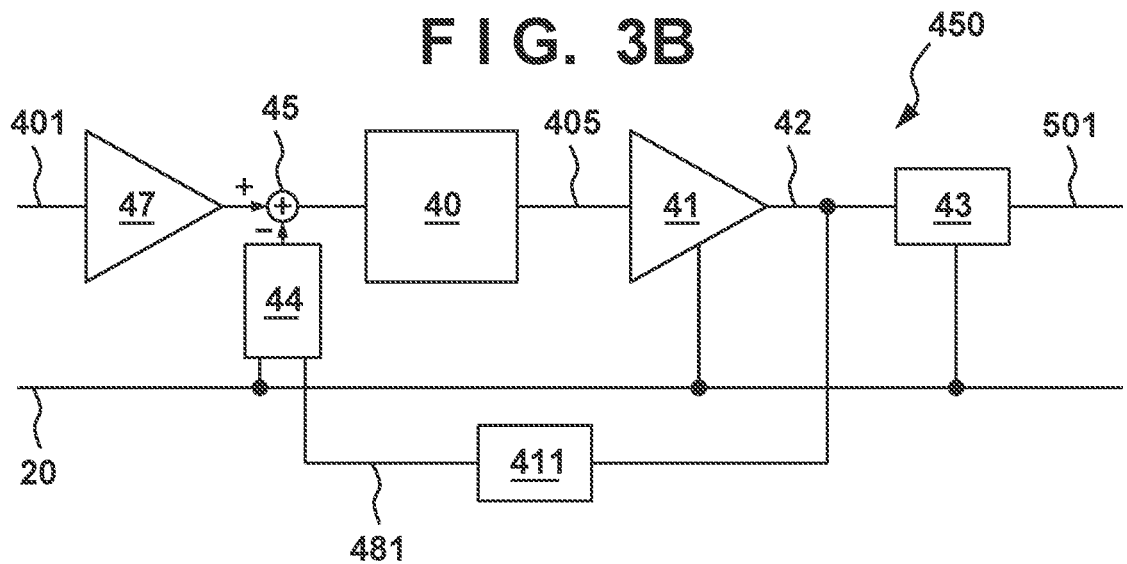

FIG. 3A shows a case in which a voltage signal is input as a pixel signal via the signal line 401. On the other hand, FIG. 3B shows a case in which a current signal is input as a pixel signal to the ΔΣ A/D converter 450. When a current signal is to be supplied as a pixel signal to the ΔΣ A/D converter 450 via the signal line 401, the signal processor 600 will need to convert the pixel signal from a voltage signal into a current signal because a signal output from the pixel 11 is a voltage signal as described above. Hence, the signal processor 600 further includes a conversion circuit that converts the pixel signal from a voltage signal into a current signal. For example, the sample-and-hold unit 300 may be arranged to include a conversion circuit so that a signal output from the sample-and-hold unit 300 will be a current signal. In addition, for example, as shown in FIG. 3B, a conversion circuit 47 that converts a voltage signal into a current signal may be arranged between the sample-and-hold unit 300 and the ΔΣ A/D converter 450. A pixel signal that has been converted into a current signal can be input to the subtracter 45 by such arrangement. Note that as described above, since the delay unit 46 represents a delay component in the circuit or a signal line in the ΔΣ A/D converter 450 and there may be a case in which no element is included as the delay unit 46, the delay unit 46 is not illustrated in FIG. 3B and drawings thereafter.

Figure 3C:
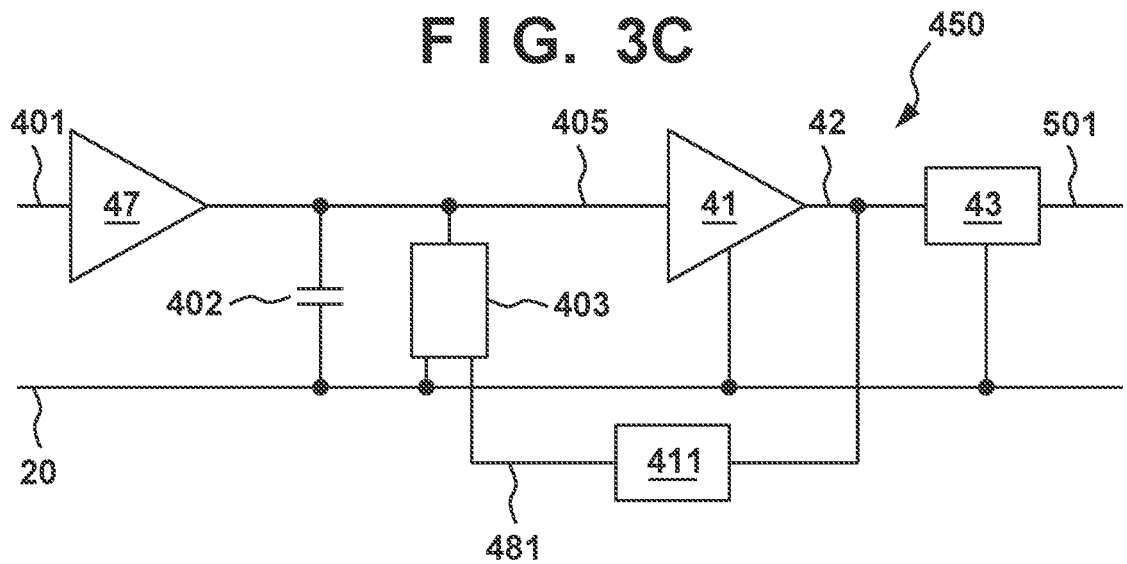

FIG. 3C shows an example of a more specific arrangement of the ΔΣ A/D converter 450 in which a pixel signal that has been converted into a current signal is input. A capacitive element 402 is arranged as the above-described integrator 40. In addition, a D/A converter 403 is arranged as the above-described D/A converter 44. The capacitive element 402 is connected in parallel to the D/A converter 403. In the arrangement shown in FIG. 3C, the D/A converter 403 can include a current supply source for supplying a current to the signal line 405. In addition, this change (for example, the change between supplying and not supplying of the current) in the current amount supplied to the signal line 405 by the D/A converter 403 in accordance with the output (comparison result) from the comparator 41 corresponds to the operation of the subtracter 45 described above.

Figure 5A:
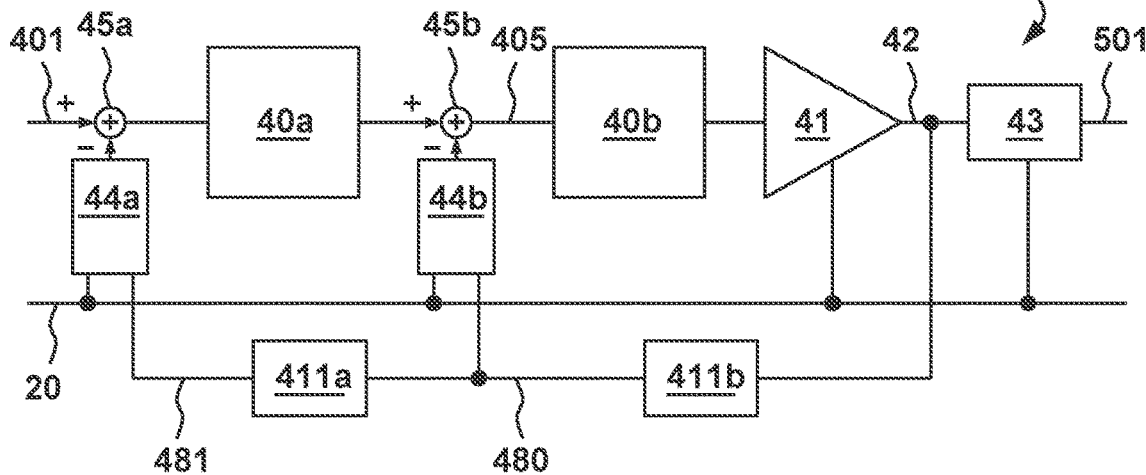
FIGS. 5A and 5B are views each showing an example of the arrangement of the ΔΣ A/D converter of the photoelectric conversion device of FIG. 1.

The $\Delta\Sigma$ A/D converter arranged in the A/D conversion unit 400 is not limited to an arrangement that performs first-order $\Delta\Sigma$ modulation in the manner of the $\Delta\Sigma$ A/D converter 450 shown in FIGS. 3A to 3C. As shown in FIG. 5A, a $\Delta\Sigma$ A/D converter 451 that performs second-order $\Delta\Sigma$ modulation may be arranged in the A/D conversion unit 400. Assume that the subtracter 45, the integrator 40, and the D/A converter 44 shown in FIG. 3A are set as a subtracter 45a, an integrator 40a, and a D/A converter 44a, respectively. In this case, the $\Delta\Sigma$ A/D converter 451 further includes an integrator 40b, a subtracter 45b, and a D/A converter 44b. The integrator 40b is connected between the integrator 40a and the comparator 41. The subtracter 45b includes an input (+) terminal which receives the output from the integrator 40a and an input (−) terminal to which a subtraction signal from the D/A converter 44b is input. The subtracter 45b outputs a subtraction result to the integrator 40b. In addition, as the buffer unit 411, a buffer unit 411a is arranged between the comparator 41 and the D/A converter 44a, and a buffer unit 411b is arranged between the comparator 41 and the D/A converter 44b. The D/A converter 44b converts the output from the buffer unit 411b into an analog signal and generates the subtraction signal to be supplied to the subtracter 45b.

In a manner similar to the arrangement shown in FIG. 3A, the buffer units 411a and 411b perform the role of impedance transformation to relay the conversion result output by the comparator 41. This will reduce the blunting of the waveform of the signal indicating the comparison result. Also, the addition of a delay amount will reduce the influence of the variation in the delay amount, thereby suppressing the degradation of the accuracy of the A/D conversion. The buffer units 411a and 411b may include, for example, the amplifier 423 as shown in FIG. 4A. The accuracy of the A/D conversion can be further improved by causing the $\Delta\Sigma$ A/D converter 451 to perform second-order $\Delta\Sigma$ modulation. Furthermore, a $\Delta\Sigma$ A/D converter that has an arrangement to perform higher-order $\Delta\Sigma$ modulation such as $\Delta\Sigma$ modulation with an order of 3 or higher may be arranged in the A/D conversion unit 400.

Although the two buffer units 411a and 411b may be arranged as the buffer units as shown in FIG. 5A, the present invention is not limited to this. For example, only the buffer unit 411b may be arranged in the $\Delta\Sigma$ A/D converter 451. Even in such a case, the output from the comparator 41 which is to be supplied to the D/A converter 44a and the D/A converter 44b can be buffered. Alternatively, for example, only the buffer unit 411a may be arranged in the $\Delta\Sigma$ A/D converter 451. Since the distance from the output terminal of the comparator 41 to the input terminal of the D/A converter 44a is longer than the distance from the output terminal of the comparator 41 to the input terminal of the D/A converter 44b, the influence from the parasitic load of the signal line 42 can be greater. Hence, only the buffer unit 411a will be arranged between the output terminal of the comparator 41 and the input terminal of the D/A converter 44a, a buffered signal will be supplied to the D/A converter 44a, and no buffer unit will be arranged between the output terminal of the comparator 41 and the input terminal of the D/A converter 44b. This will suppress the difference in the influence of the parasitic load present between the output terminal of the comparator 41 and the input terminal of the D/A converter 44a and the influence of the parasitic load present between the output terminal of the comparator 41 and the input terminal of the D/A converter 44b. As a result, the accuracy of the A/D conversion can be improved.

Figure 5B:
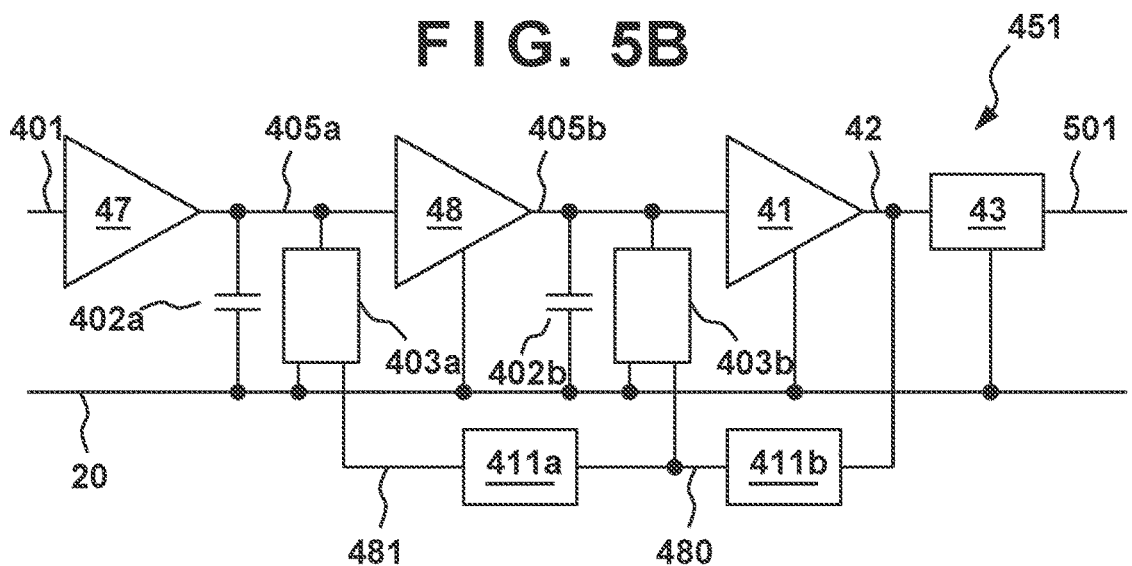
Figure 11:
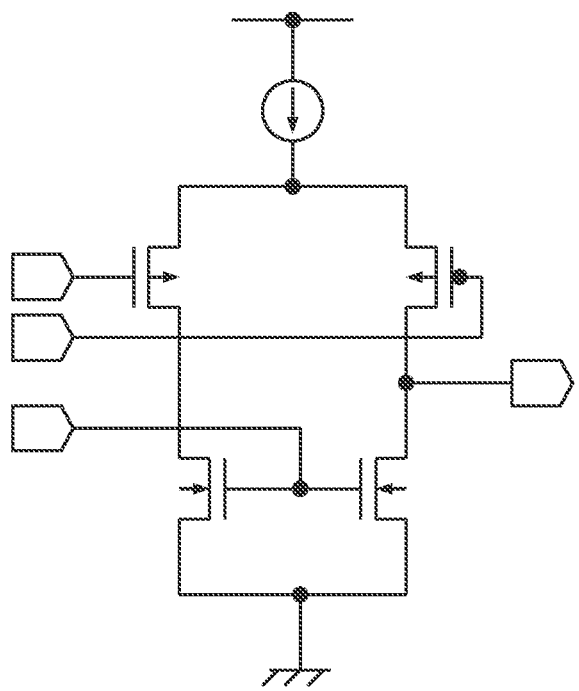
FIG. 11 is a view showing an example of a current-to-voltage conversion circuit of the photoelectric conversion device of FIG. 1.

FIG. 5B is a view showing an example of the arrangement for performing second-order $\Delta\Sigma$ modulation when a pixel signal which has been converted into a current signal is to be input to the $\Delta\Sigma$ A/D converter 451. Two sets of the capacitive element 402 and the D/A converter 403 are arranged. A capacitive element 402a functions as the integrator 40a of FIG. 5A, and a D/A converter 403a functions as the subtracter 45a and the D/A converter 44a of FIG. 5A. In a similar manner, a capacitive element 402b functions as the integrator 40b of FIG. 5A, and a D/A converter 403b functions as the subtracter 45b and the D/A converter 44b of FIG. 5A. The capacitive element 402b is connected in parallel to the D/A converter 403b. A current-to-voltage conversion circuit 48 is arranged between the two sets of the capacitive element and the D/A converter. A gm amplifier, for example, as shown in FIG. 11 may be used for the current-to-voltage conversion circuit 48. Conversion circuits which have the same arrangement or circuits which have different arrangements may be used for the current-to-voltage conversion circuit 48 and the conversion circuit 47 for supplying a current signal to the $\Delta\Sigma$ A/D converter 451. It is sufficient as long as appropriate circuits are used in accordance with the respective specifications of the conversion circuit 47 and the current-to-voltage conversion circuit 48.

Figure 6:
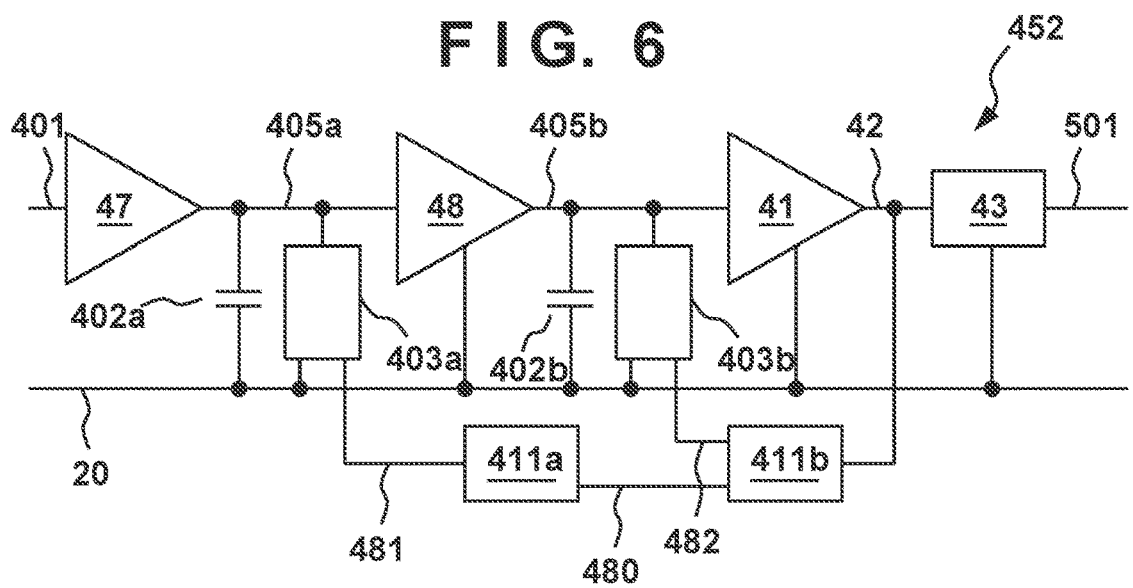
FIG. 6 is a view showing an example of the arrangement of the ΔΣ A/D converter of the photoelectric conversion device of FIG. 1.

A modification of the $\Delta\Sigma$ A/D converter 451 shown in FIG. 5B will be described next with reference to FIGS. 6, 7A, and 7B. In the $\Delta\Sigma$ A/D converter 451 shown in FIG. 5B, the output from the buffer unit 411b is supplied to the buffer unit 411a and the D/A converter 403b via a common signal line 480. On the other hand, in a $\Delta\Sigma$ A/D converter 452 shown in FIG. 6, the output from the buffer unit 411b is supplied to the buffer unit 411a via the signal line 480 and supplied to D/A converter 403b via a signal line 482 which is separate from the signal line 480.

Figure 7A:
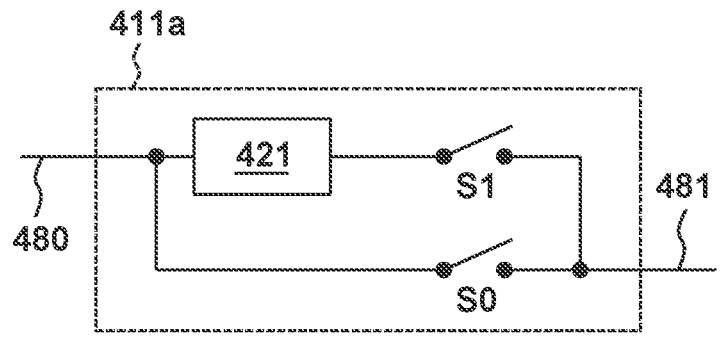
FIGS. 7A and 7B are views each showing an example of the arrangement of the buffer unit of the ΔΣ A/D converter of the photoelectric conversion device of FIG. 1.
Figure 7B:
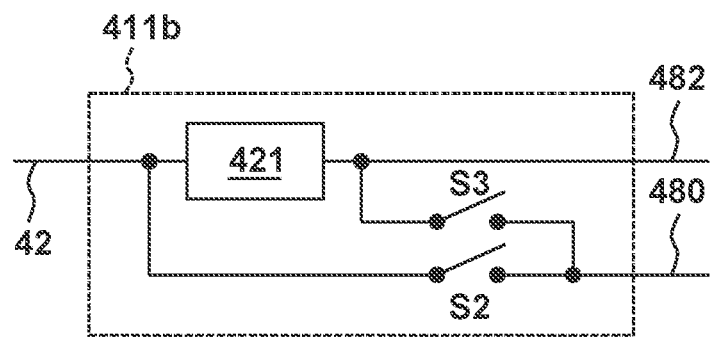

FIGS. 7A and 7B show the arrangement example of the buffer unit 411a and the arrangement example of the buffer unit 411b, respectively. The buffer units 411a and 411b each include a phase adjuster 421 as shown in FIGS. 7A and 7B. This allows each of the buffer units 411a and 411b to perform phase adjustment on the output from the comparator 41.

Phase adjustment may be performed on both the signal supplied to the D/A converter 403a and the signal supplied to the D/A converter 403b or may be performed on one of the signal supplied to the D/A converter 403a and the signal supplied to the D/A converter 403b. The combination to be used to execute phase adjustment can be switched by appropriately selecting switches S0 to S3 shown in FIGS. 7A and 7B to set a conductive state or a non-conductive state. At this time, control may be performed so that the phase relationship between the phase of the output from the comparator 41 for controlling the D/A converter 403a and the phase of the output from the comparator 41 for controlling the D/A converter 403b will constantly have the same relationship. For example, the phase of a signal supplied via a signal line 481 to the D/A converter 403a on the upstream side with respect to the input of a pixel signal may occur ahead of the phase of a signal supplied to the D/A converter 403b via the signal line 482. However, the present invention is not limited to this, and the phase of the signal supplied to the D/A converter 403a may lag behind the phase of the signal supplied to the D/A converter 403b. The phase relationship can be appropriately set to improve the accuracy of the A/D conversion or to suppress the variation among the columns corresponding to the vertical signal lines 12.

For example, the phase of an output signal from the comparator 41 supplied to the D/A converter 403b which was occurring ahead of the phase of an output signal supplied to the D/A converter 403a may lag due to a change in the parasitic load amount caused by an environmental change, and the phase of the output signal supplied to the D/A converter 403a may occur ahead during an operation. If the phase (timing) of the signal output from the comparator 41 to each of the D/A converters 403a and 403b changes, the results of the A/D conversion may increasingly vary. Hence, it will be possible to improve the accuracy of the A/D conversion by providing a phase adjustment function to each of the buffer units 411a and 411b.

The buffer unit 411 may perform phase adjustment on the output from the comparator 41 even in the ΔΣ A/D converter 450 which performs first-order ΔΣ modulation and is shown in FIGS. 3A to 3C. The accuracy of the A/D conversion can be improved by adjusting the phase so that each signal output from the comparator 41 and supplied to the D/A converters 44 and 403 will have an appropriate delay amount.

In addition, for example, in a manner similar to the buffer unit 411 shown in FIG. 4A described above, the level shifter 424 and the amplifier 423 using the inverter circuit 420 or the like may be arranged in each of the buffer units 411a and 411b. By appropriately combining the amplifier 423, the level shifter 424, and the phase adjuster 421, the buffer units 411a and 411b can appropriately combine and perform amplification, level conversion, and phase adjustment on the output from the comparator 41. Also in this case, the signal output from the comparator 41 may be buffered by combining one or a plurality of the amplification, level conversion, and phase adjustment operations by arranging so that each of the buffer units 411a and 411b will have a plurality of paths which are switchable by a switch. In this case, different buffering processes may be performed by the buffer units 411a and 411b.

Figure 8:
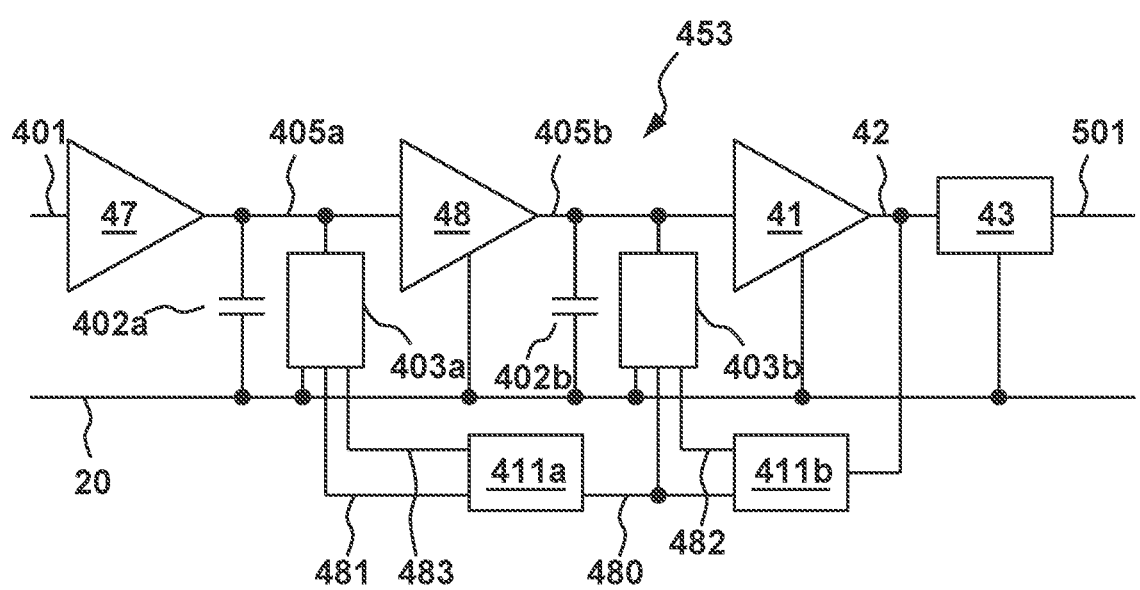
FIG. 8 is a view showing an example of the arrangement of the ΔΣ A/D converter of the photoelectric conversion device of FIG. 1.

Another modification of the ΔΣ A/D converter 451 shown in FIG. 5B will be described next with reference to FIGS. 8, 9A, 9B, 10A, and 10B. FIG. 8 is a view showing an example of the arrangement of a ΔΣ A/D converter 453 which performs A/D conversion on a pixel signal converted into a current signal. A pixel signal supplied via the signal line 401 may have a wide dynamic range in accordance with the increase in the dynamic range of the photoelectric conversion device 100. In order to perform A/D conversion on a pixel signal which has a wide dynamic range without losing the signal range, an analog switch will be used as a switch to supply a current from a current supply source arranged in each of the D/A converters 403a and 403b to a corresponding one of signal lines 405a and 405b.

Figure 9A:
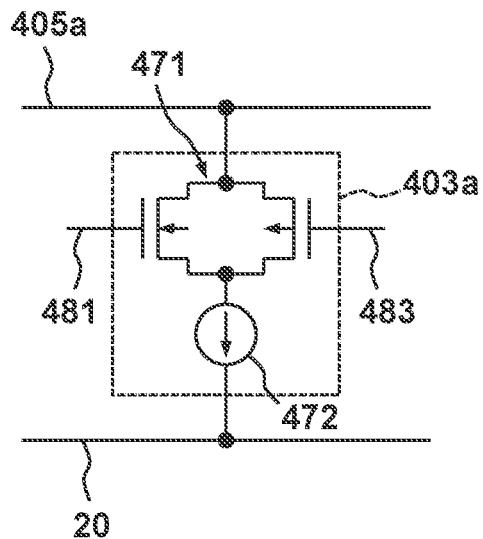
FIGS. 9A and 9B are views each showing an example of the arrangement of a D/A converter of the ΔΣ A/D converter of the photoelectric conversion device of FIG. 1.
Figure 9B:
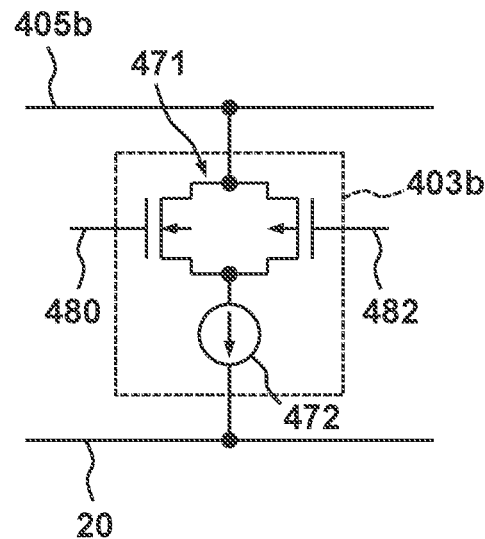

FIGS. 9A and 9B are views showing an example of the arrangement of the D/A converters 403a and 403b, respectively. As shown in FIGS. 9A and 9B, each of the D/A converters 403a and 403b includes a current supply source 472 and an analog switch 471 (CMOS analog switch) for controlling the supply of current from the current supply source 472 to the corresponding one of the signal lines 405a and 405b.

Figure 10A:
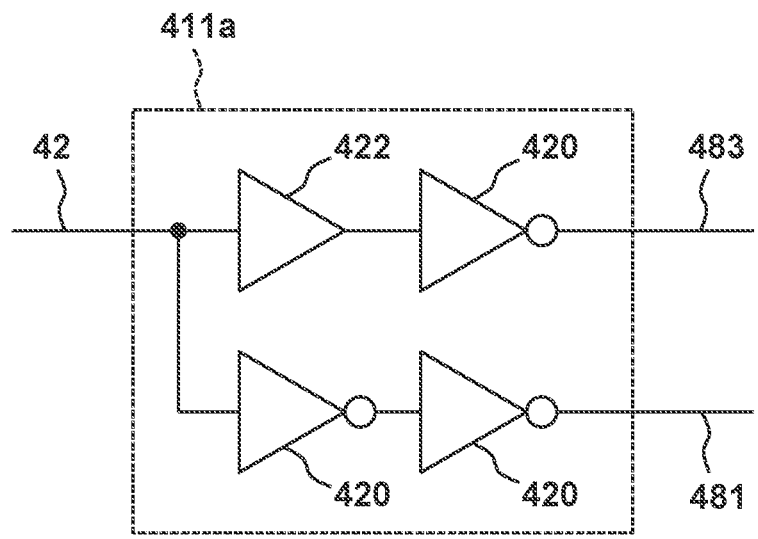
FIGS. 10A and 10B are views each showing an example of the arrangement of the buffer unit of the ΔΣ A/D converter of the photoelectric conversion device of FIG. 1.
Figure 10B:
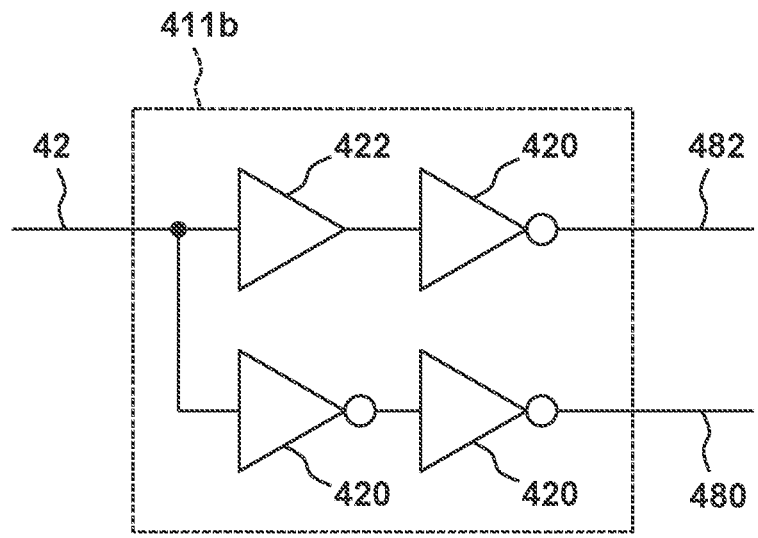

FIGS. 10A and 10B are views showing an example of the arrangement of the buffer units 411a and 411b, respectively, for supplying the signal output from the comparator 41 to the D/A converters 403a and 403b. To make the analog switch 471 shown in FIGS. 9A and 9B operate, each of the buffer units 411a and 411b will buffer the output from the comparator 41 to generate a non-inverting signal and an inverting signal in correspondence with the comparison result output from the comparator 41. The analog switch 471 will operate in accordance with the non-inverting signal and the inverting signal. More specifically, each of the buffer units 411a and 411b includes the inverter circuits 420 and a non-inverting amplification circuit 422. In the buffer unit 411a, for each comparison result signal output from the comparator 41 and received via the signal line 42, a non-inverting signal to be output to the signal line 481 via the inverter circuits 420 and an inverting signal to be output to a signal line 483 via the inverter circuit 420 and the non-inverting amplification circuit 422 are generated. As shown in FIG. 8, the non-inverting signal and the inverting signal are supplied via the signal lines 481 and 483, respectively, from the buffer unit 411a to the D/A converter 403a. In a similar manner, in the buffer unit 411b, for each comparison result signal received via the signal line 42, a non-inverting signal to be output to the signal line 480 via the inverter circuits 420 and an inverting signal to be output to the signal line 482 via the inverter circuit 420 and the non-inverting amplification circuit 422 are generated. As shown in FIG. 8, the non-inverting signal and the inverting signal are supplied via the signal lines 480 and 482, respectively, from the buffer unit 411b to the D/A converter 403b.

The non-inverting signals and the inverting signals with aligning phases are generated by the buffer units 411a and 411b based on the comparison result signal as a control signal output from the comparator 41, and the generated signals are supplied to the D/A converters 403a and 403b. Hence, the analog switch 471 arranged in each of the D/A converters 403a and 403b can be appropriately controlled. By proving such an arrangement to the buffer units 411a and 411b and the D/A converters 403a and 403b, it will be possible to perform an appropriate conversion operation without losing the signal range even in a case in which the pixel signal has a wide dynamic range. As a result, it will be possible to suppress the degradation of the accuracy of the A/D conversion and suppress the variation in the A/D conversion operations among the columns.

In addition, level conversion processing may be performed by arranging the above-described level shifter 424 in each of the buffer units 411a and 411b shown in FIGS. 10A and 10B. This is for a case in which the operation voltage of the comparator 41 differs from the operation voltages of the signal lines 405a and 405b generated by the capacitive elements 402a and 402b functioning as the integrator 40. Furthermore, phase adjustment may be performed in a manner similar to that as described above by arranging the phase adjuster 421 in each of the buffer units 411a and 411b.

Figure 12:
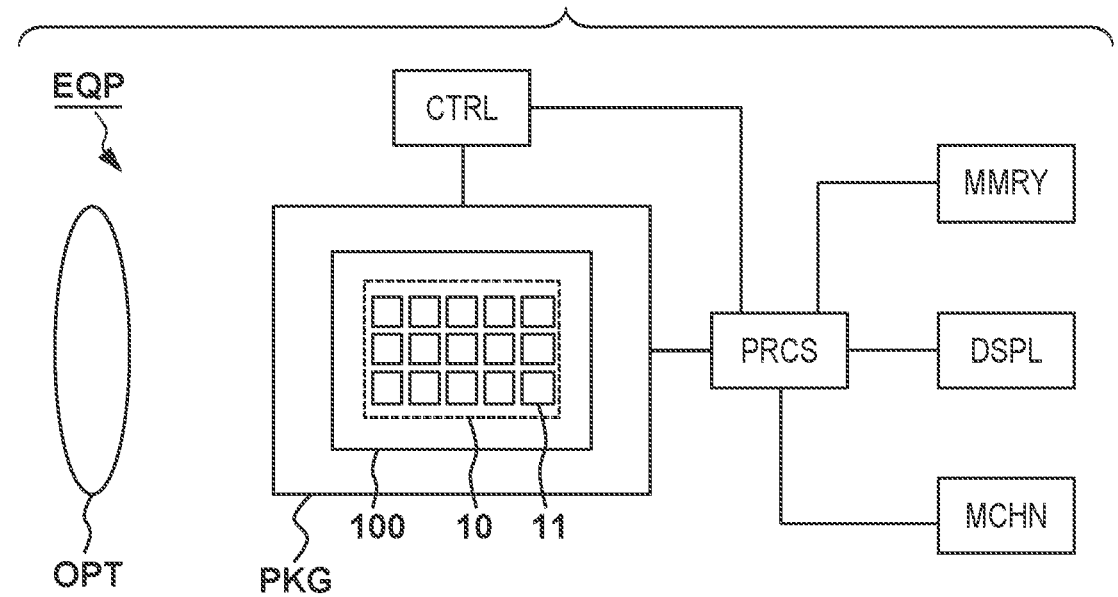
FIG. 12 is a block diagram showing an example of the arrangement of a camera incorporating the photoelectric conversion device according to the embodiment.

An application example of the photoelectric conversion device 100 according to the embodiment described above will be described hereinafter. FIG. 12 is a schematic view of an electronic device EQP incorporating the photoelectric conversion device 100. FIG. 12 shows a camera as an example of the electronic device EQP. The concept of a camera here not only includes an apparatus whose main object is image capturing, but also an apparatus (for example, a personal computer or a mobile terminal such as a smartphone) that has an image capturing function auxiliary.

The photoelectric conversion device 100 can be a semiconductor chip with a stacked structure including the pixel unit 10. As shown in FIG. 12, the photoelectric conversion device 100 is contained in a semiconductor package PKG. The semiconductor package PKG can include a base to which the photoelectric conversion device 100 is fixed, a lid such as glass facing the photoelectric conversion device 100, and a conductive connecting member such as a bonding wire or bump used to connect the terminal arranged in the base to a terminal arranged in the photoelectric conversion device 100. The device EQP may further include at least one of an optical system OPT, a control device CTRL, a processing device PRCS, a display device DSPL, and a storage device MMRY.

The optical system OPT is a system for forming an image on the pixel unit 10 of the photoelectric conversion device 100, and can be, for example, a lens, a shutter, and a mirror. The control device CTRL is a device for controlling the operation of the photoelectric conversion device 100, and can be, for example, a semiconductor device such as an ASIC or the like. The processing device PRCS is a device for processing the signal output from the photoelectric conversion device 100, and can be, for example, a semiconductor device such as a CPU, an ASIC, or the like. The display device DSPL can be an EL display device or a liquid crystal display device that displays image data obtained by the photoelectric conversion device 100. The storage device MMRY is a magnetic device or a semiconductor device for storing the image data obtained by the photoelectric conversion device 100. The storage device MMRY can be a volatile memory such as SRAM, DRAM, or the like or a nonvolatile memory such as a flash memory or a hard disk drive. A mechanical device MCHN includes a driving unit or propulsion unit such as a motor, an engine, or the like. The mechanical device MCHN in the camera can drive the components of the optical system OPT for zooming, focusing, and shutter operations. In the equipment EQP, image data output from the photoelectric conversion device 100 is displayed on the display DSPL and is transmitted to an external device by a communication device (not shown) included in the equipment EQP. Hence, the equipment EQP may also include the storage device MMRY and the processing device PRCS as shown in FIG. 12.

The camera incorporating the photoelectric conversion device 100 is applicable as a monitoring camera or an onboard camera mounted in a transportation equipment such as an automobile, a railroad car, a ship, an airplane, an industrial robot, or the like. In addition, the camera incorporating the photoelectric conversion device 100 is not limited to a transportation equipment but is also applicable to a device that widely uses object recognition such as an intelligent transportation system (ITS).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-016894, filed Feb. 4, 2021 which is hereby incorporated by reference herein in its entirety.

What is claimed is:

1. A photoelectric conversion device comprising a pixel unit in which a plurality of pixels each including a photoelectric conversion element are arranged in a matrix, and a signal processor configured to process a pixel signal output from the pixel unit via a vertical signal line, wherein the signal processor comprises a $\Delta\Sigma$ A/D converter configured to convert the pixel signal into a digital signal, the $\Delta\Sigma$ A/D converter comprises a subtracter which includes a first input terminal to which the pixel signal is input and a second input terminal to which a subtraction signal is input, an integrator configured to receive an output from the subtracter, a comparator configured to compare an output from the integrator with a predetermined voltage, a decimation filter configured to generate the digital signal based on a comparison result output from the comparator, a delay unit configured to delay an output from the comparator, a buffer unit configured to buffer an output from the delay unit, and a D/A converter configured to convert an output from the buffer unit into an analog signal to generate the subtraction signal.

2. The device according to claim 1, wherein the signal processor further comprises a conversion circuit configured to convert the pixel signal from a voltage signal into a current signal, and the pixel signal converted into the current signal is input to the subtracter.

3. A photoelectric conversion device comprising a pixel unit in which a plurality of pixels each including a photoelectric conversion element are arranged in a matrix, and a signal processor configured to process a pixel signal output from the pixel unit via a vertical signal line, wherein the signal processor comprises a conversion circuit configured to convert the pixel signal from a voltage signal into a current signal and a $\Delta\Sigma$ A/D converter configured to convert the pixel signal, which has been converted into the current signal by the conversion circuit, into a digital signal, the $\Delta\Sigma$ A/D converter includes a subtracter which comprises a first input terminal to which the pixel signal is input and a second input terminal to which a subtraction signal is input, an integrator configured to receive an output from the subtracter, a comparator configured to compare an output from the integrator with a predetermined voltage, a decimation filter configured to generate the digital signal based on a comparison result output from the comparator, a buffer unit configured to buffer an output from the comparator, and a D/A converter configured to convert an output from the buffer unit into an analog signal to generate the subtraction signal.

4. The device according to claim 2, wherein the integrator comprises a capacitive element which is connected in parallel to the D/A converter.

5. The device according to claim 2, wherein the D/A converter comprises a current supply source.

6. The device according to claim 2, wherein the buffer unit is configured to buffer the comparison result to generate a non-inverting signal and an inverting signal based on the comparison result, and the D/A converter comprises an analog switch configured to operate in accordance with the non-inverting signal and the inverting signal.

7. The device according to claim 1, wherein the buffer unit comprises an amplifier.

8. The device according to claim 1, wherein the buffer unit comprises a phase adjuster.

9. The device according to claim 1, wherein the buffer unit comprises a level shifter.

10. The device according to claim 1, wherein the subtracter is a first subtracter, the integrator is a first integrator, the D/A converter is a first D/A converter, and the subtraction signal is a first subtraction signal, and the ΔΣ A/D converter further comprises a second integrator connected between the first integrator and the comparator, a second subtracter which is configured to output a subtraction result to the second integrator and comprises a third input terminal configured to receive an output from the first integrator and a fourth input terminal to which a second subtraction signal is input, and a second D/A converter configured to convert the output from the buffer unit into an analog signal to generate the second subtraction signal.

11. The device according to claim 10, wherein the buffer unit is configured to buffer the comparison result to perform phase adjustment on the comparison, and is configured to supply comparison results which have different phases from each other to the first D/A converter and the second D/A converter.

12. The device according to claim 11, wherein the buffer unit is configured to perform phase adjustment so that the phase of the comparison result to be supplied to the first D/A converter will occur ahead of the phase of the comparison result to be supplied to the second D/A converter.

13. The device according to claim 10, wherein the second integrator comprises a conversion unit configured to convert an output from the second subtracter from a voltage signal into a current signal and a capacitive element which is connected in parallel to the second D/A converter.

14. The device according to claim 13, wherein the second D/A converter comprises a current supply source.

15. An electronic device comprising:
the photoelectric conversion device according to claim 1; and
a control device configured to control an operation of the photoelectric conversion device.

* * * * *